(12) United States Patent
Chang

(10) Patent No.: US 8,710,516 B2
(45) Date of Patent: Apr. 29, 2014

(54) TOUCH PANEL STRUCTURE AND MANUFACTURING METHOD THEREOF

(75) Inventor: Chih-Shun Chang, New Taipei (TW)

(73) Assignee: Fortrend Taiwan Scientific Corp., New Taipei (TW)

( * ) Notice: Subject to any disclaimer, the term of this patent is extended or adjusted under 35 U.S.C. 154(b) by 236 days.

(21) Appl. No.: 13/309,667

(22) Filed: Dec. 2, 2011

(65) Prior Publication Data

US 2013/0038568 A1    Feb. 14, 2013

(30) Foreign Application Priority Data

Aug. 10, 2011 (TW) .............................. 100128570 A
Aug. 10, 2011 (TW) .............................. 100214838 U

(51) Int. Cl.
*H01L 33/08* (2010.01)
*H01L 27/32* (2006.01)
*G06F 3/041* (2006.01)

(52) U.S. Cl.
USPC .............................. 257/88; 257/59; 345/173

(58) Field of Classification Search
None
See application file for complete search history.

(56) References Cited

U.S. PATENT DOCUMENTS

| 8,199,127 | B2 | 6/2012 | Mamba et al. | |
|---|---|---|---|---|
| 2010/0045625 | A1* | 2/2010 | Yang et al. | 345/173 |
| 2012/0113021 | A1* | 5/2012 | Liu et al. | 345/173 |
| 2012/0113063 | A1* | 5/2012 | Kim et al. | 345/176 |
| 2012/0292105 | A1* | 11/2012 | Fujita | 174/84 R |

FOREIGN PATENT DOCUMENTS

| CN | 101271373 | A | 9/2008 | |
|---|---|---|---|---|
| CN | 101639593 | A | 2/2010 | |
| CN | 101853115 | A | 10/2010 | |
| CN | 101989134 | A | 3/2011 | |
| JP | 58-211244 | A | 12/1983 | |
| JP | 2008-134975 | A | 6/2008 | |
| JP | 2009-205321 | A | 9/2009 | |
| JP | 2010-140369 | A | 6/2010 | |
| JP | 2010-256981 | A | 11/2010 | |
| JP | 2011-059834 | A | 3/2011 | |
| JP | 2011-075809 | A | 4/2011 | |
| JP | 2011-076386 | A | 4/2011 | |
| JP | 2011-150550 | | * 8/2011 | ............. G06F 3/041 |
| TW | 201039220 | A | 11/2010 | |
| WO | 2011/089975 | A1 | 7/2011 | |

OTHER PUBLICATIONS

TW Office Action Search Report dated Dec. 24, 2013 as received in Application No. 100128570.

* cited by examiner

*Primary Examiner* — Zandra Smith
*Assistant Examiner* — Pamela E Perkins
(74) *Attorney, Agent, or Firm* — Maschoff Brennan

(57) ABSTRACT

A manufacturing method of a touch panel structure includes the following steps. A first conductive layer is formed on a mounting surface of a substrate, and the first conductive layer has multiple first electrodes. A first electrical-insulation layer is formed on the mounting surface of the substrate, and the first electrical-insulation layer covers each of the first electrodes of the first conductive layer. A second conductive layer is formed on the first electrical-insulation layer; the second conductive layer has multiple second electrodes, and each of the second electrodes crisscrosses each of the first electrodes. A second electrical-insulation layer is formed on the first electrical-insulation layer, and the second electrical-insulation layer covers each of the second electrodes of the second conductive layer.

5 Claims, 3 Drawing Sheets

TOUCH PANEL STRUCTURE AND MANUFACTURING METHOD THEREOF

CROSS-REFERENCE TO RELATED APPLICATIONS

This non-provisional application claims priority under 35 U.S.C. §119(a) on Patent Application No(s). 100128570 filed in Taiwan, R.O.C. on Aug. 10, 2011 and Patent Application No. 100214838 filed in Taiwan, R.O.C. on Aug. 10, 2011, the entire contents of which are hereby incorporated by reference.

BACKGROUND

1. Technical Field

The disclosure relates to touch panels, and more particularly to touch panel structures and manufacturing methods thereof.

2. Related Art

With the gradual industrial development, digital tools such as mobile phones, personal digital assistants (PDAs), notebooks and planet computers are all developed to be more convenient, multifunctional, and beautiful.

In recent years, with the application and rapid development of wireless mobile communication and information appliances and other information technologies, in order to achieve the higher portability, smaller size and more humane design, lots of information products adopt touch panels as input device, instead of a the conventional keyboard and mouse. Among the products, capacitive touch screens are the most popular products at present.

With respect to the capacitive touch screens, since two electrode layers (namely, electrode layers that respectively generate X-coordinate signals and Y-coordinate signals) of the capacitive touch screen are at different levels, differences in transmittance is caused. In another aspect, when using a display device or a photoelectric device having the capacitive touch screen, a user may easily notice the existence of the capacitive touch screen. Specifically, the user may easily notice the regions of the capacitive touch screen where the electrode layer is arranged (patterned regions or non-hollow regions) and the regions of the capacitive touch screen where no electrode layer is arranged (non-patterned regions or hollow regions) since great differences in reflectivity between the patterned area and a non-patterned area. Accordingly, when using display device or a photoelectric device, the users may see diamond-shaped grids, which are the shapes the electrodes of the capacitive touch screen, on the capacitive touch screen. Therefore, the inventor recognizes that to improve the overall uniformity of the image of the capacitive touch panel and therefore, to enhance the visual effect of the capacitive touch panel is an urgent task in the production technology of the capacitive touch screen.

SUMMARY

In one embodiment, a manufacturing method of a touch panel structure comprises following steps. A first conductive layer is formed on a mounting surface of a substrate, and the first conductive layer has multiple first electrodes. A first electrical-insulation layer is formed on the mounting surface of the substrate, and the first electrical-insulation layer covers each of the first electrodes of the first conductive layer. A second conductive layer is formed on the first electrical-insulation layer; the second conductive layer has multiple second electrodes, and each of the second electrodes crisscrosses with each of the first electrodes. A second electrical-insulation layer is formed on the first electrical-insulation layer, and the second electrical-insulation layer covers each of the second electrodes of the second conductive layer.

In an embodiment, before the step of forming the first electrical-insulation layer, the method further comprises forming a peelable mask on a circuit arrangement area of the first conductive layer.

In an embodiment, the first electrodes are separated from each other and arranged in a first direction, the second electrodes are separated from each other and arranged in a second direction, and an included angle is formed between the second direction and the first direction.

In an embodiment, the substrate is made of glass.

In an embodiment, the first conductive layer and the second conductive layer are made of indium tin oxide (ITO).

In an embodiment, the first electrical-insulation layer and the second electrical-insulation layer are made of electrical-insulation photoresist material.

In another embodiment, the disclosure further provides a touch panel structure, which comprises a substrate, a first conductive layer, a first electrical-insulation layer, a second conductive layer and a second electrical-insulation layer. The substrate has a mounting surface. The first conductive layer is arranged on the mounting surface, and the first conductive layer has multiple first electrodes. The first electrical-insulation layer is disposed on the mounting surface and covers each of the first electrodes of the first conductive layer. The second conductive layer is disposed on the first electrical-insulation layer; the second conductive layer has multiple second electrodes, and each of the second electrodes crisscrosses each of the first electrodes. The second electrical-insulation layer is arranged on the first electrical-insulation layer and covers each of the second electrodes of the second conductive layer.

In yet another embodiment, the disclosure further provides a touch panel structure, which comprises a substrate, a first conductive layer, a first electrical-insulation layer, a second conductive layer and a second electrical-insulation layer. The substrate has a mounting surface. The first conductive layer is disposed on the mounting surface, and the first conductive layer has multiple first electrodes. The first electrical-insulation layer is disposed on the mounting surface, and a gap is formed between the first electrical-insulation layer and the first conductive layer. The second conductive layer is disposed on the first electrical-insulation layer; the second conductive layer has multiple second electrodes, and each of the second electrodes crisscrosses each of the first electrodes. The second electrical-insulation layer is disposed on the first conductive layer and the second conductive layer, covers each of the first electrodes and each of the second electrodes, and fills the gap.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

The disclosure is related to touch panel structures and manufacturing method thereof, so that reflectivity of a patterned area and a non-patterned area in a touch panel are similar, therefore improving overall uniformity of images of the touch panel.

Figure 1:
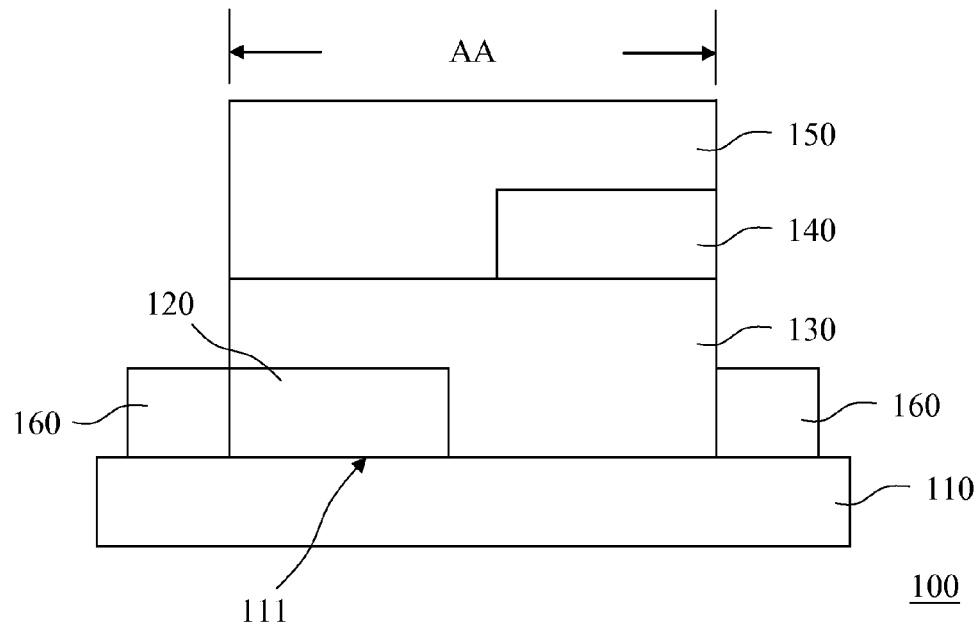
FIG. 1 is a sectional view of a touch panel structure according to the disclosure.

Referring to FIG. 1, it is a sectional view of a touch panel structure according to an embodiment. The touch panel structure 100 comprises a substrate 110, a first conductive layer 120, a first electrical-insulation layer 130, a second conductive layer 140 and a second electrical-insulation layer 150.

In this embodiment, the substrate 110 may be a transparent substrate, and the transparent substrate may be made of, for example, glass. The substrate has a mounting surface 111. Then, the first conductive layer 120 is formed on the mounting surface 111 of the substrate 110, and the first conductive layer 120 has multiple first electrodes. The first conductive layer 120 may be a transparent conductive layer, and the material of the transparent conductive layer may be, but is not limited to, ITO.

The first electrical-insulation layer 130 is formed on the mounting surface 111 of the substrate 110, and the first electrical-insulation layer 130 covers each of the first electrodes of the first conductive layer 120. The material of the first electrical-insulation layer 130 may be, but is not limited to, an electrical-insulation photoresist material, and the electrical-insulation photoresist material is, for example, acetic esters. Then, the second conductive layer 140 is formed on the first electrical-insulation layer 130; the second conductive layer 140 has multiple second electrodes, and each of the second electrodes crisscrosses each of the first electrodes. The second conductive layer 140 may be a transparent conductive layer, and the material of the transparent conductive layer may be, but is not limited to, ITO.

The second electrical-insulation layer 150 is disposed on the first electrical-insulation layer 130, and the second electrical-insulation layer 150 covers the second conductive layer 140. The material of the second electrical-insulation layer 150 may be, but is not limited to, an electrical-insulation photoresist material, and the electrical-insulation photoresist material is, for example, acetic esters.

In this embodiment, the first electrical-insulation layer 130 and the second electrical-insulation layer 150 may be formed by spray coating, and the first conductive layer 120 and the second conductive layer 140 may be formed by screen printing. The first electrical-insulation layer 130 in this embodiment is formed by spray coating. Therefore, before the first electrical-insulation layer 130 is formed, a peelable mask is formed on a circuit arrangement area of the first conductive layer 120, and after the first electrical-insulation layer is formed, the peelable mask may be removed so circuits of the first conductive layer are exposed for subsequent connection of the circuits.

The first conductive layer 120, the first electrical-insulation layer 130, the second conductive layer 140 and the second electrical-insulation layer 150 are a visible area AA of the touch panel structure 100. In addition, the touch panel structure 100 further comprises a light shielding layer 160, and the light shielding layer 160 is, for example, a black matrix (BM) layer. The light shielding layer 160 is respectively arranged on the substrate 110 and located at two opposite sides of the visible area AA, namely, on the periphery of the visible area AA, for shielding a circuit connection area in the touch panel structure 100.

Figure 2:
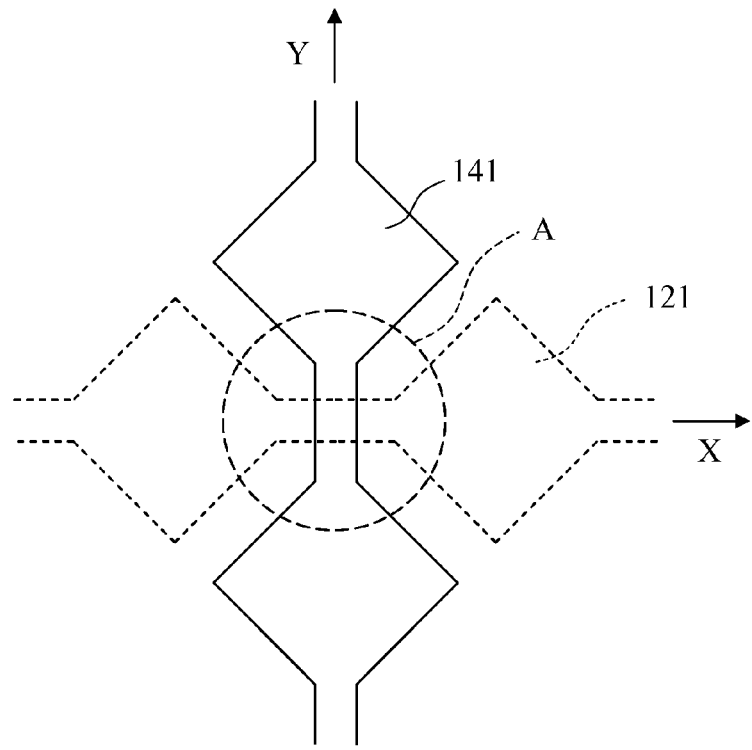
FIG. 2 is a top view of the touch panel structure according to the disclosure.

Referring to FIG. 2, FIG. 2 is a top view of the touch panel structure 100 according to another embodiment. The first conductive layer 120 has multiple first electrodes 121, and the first electrodes 121 are separated from each other and arranged in a first direction X. The second conductive layer 140 has multiple second electrodes 141, and the second electrodes 141 are separated from each other and arranged in a second direction Y. An included angle is formed between the first direction X and the second direction Y, and the included angle is, for example, an acute angle, a right angle or an obtuse angle. The right angle is taken as an example in FIG. 2, which, however, is not intended to limit the scope of the disclosure. In addition, in the intersections where the first electrodes 121 crisscrosses the second electrodes 141 (such as an area A marked in FIG. 2), the first electrodes 121 is not electrically connected to the second electrodes 141. In addition, the shape of the first electrode 121 and the second electrode 141 is, for example, a diamond, which, however, is not intended to limit the scope of the disclosure.

With the foregoing arrangement, in the touch panel (namely, the visible area AA), the reflectivity of a patterned area (namely, an area where the first electrodes or the second electrodes are arranged) is approximate to that of the non-patterned area (namely, an area where the first electrodes or the second electrodes are not arranged) so human eyes can hardly distinguish the patterned area from the non-patterned area. That is to say, when watching an electronic device with the touch panel structure 100 (for example, in the sun), a user can not notice diamond-shaped patterns, i.e. the shape of the first electrodes 121 of the first conductive layer 120 or that of the second electrodes 141 of the second conductive layer 140.

An embodiment of the touch panel structure is described above, but the disclosure is not limited thereto. Another example is taken for illustration below.

Figure 3:
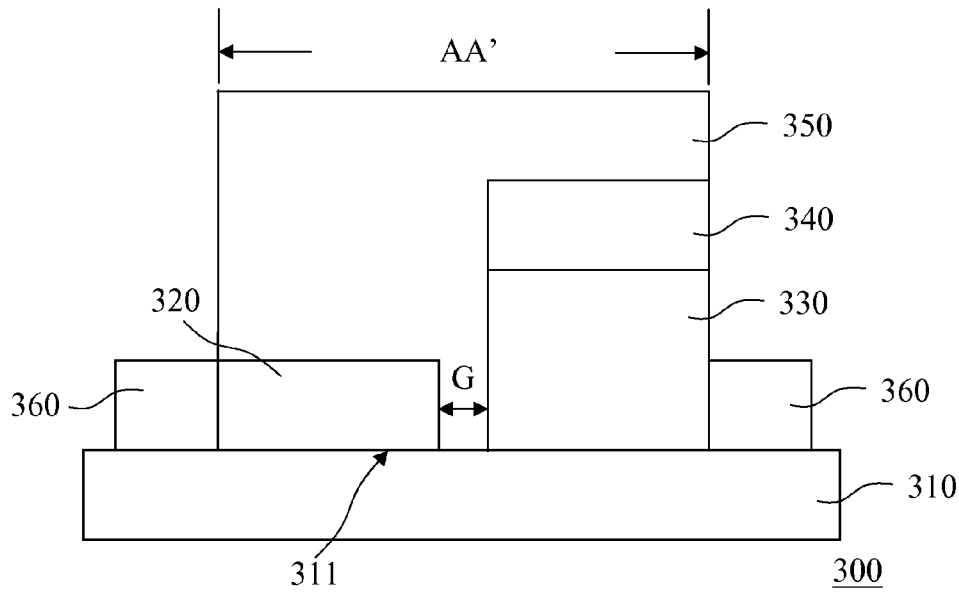
FIG. 3 is a sectional view of another touch panel structure according to the disclosure.

Referring to FIG. 3, it is a sectional view of another touch panel structure according to another embodiment. A touch panel structure 300 comprises a substrate 310, a first conductive layer 320, a first electrical-insulation layer 330, a second conductive layer 340 and a second electrical-insulation layer 350. The substrate 310 has a mounting surface 311. The first conductive layer 320 is disposed on the mounting surface 311, and the first conductive layer 310 has multiple first electrodes. The first electrical-insulation layer 330 is disposed on the mounting surface, and a gap G is formed between the first electrical-insulation layer 330 and the first conductive layer 320. The second conductive layer 340 is disposed on the first electrical-insulation layer 330; the second conductive layer 340 has multiple second electrodes, and each of the second electrodes crisscrosses each of the first electrodes. The second electrical-insulation layer 350 is disposed on the first conductive layer 320 and the second conductive layer 340, covers each of the first electrodes and each of the second electrodes, and fills the gap G. In addition, for an arrangement of the first electrodes and the second electrodes, reference may be made to the description of FIG. 2, and details are not described herein again.

In this embodiment, the second electrical-insulation layer 350 may be formed by spray coating, and the first conductive layer 320, the second conductive layer 340 and the first electrical-insulation layer 330 may be formed by screen printing. The first electrical-insulation layer 330 and the second conductive layer 340 have the same pattern. That is when the first electrical-insulation layer 330 is formed, the pattern of the first conductive layer 320 is not shielded.

The first conductive layer 320, the first electrical-insulation layer 330, the second conductive layer 340 and the second electrical-insulation layer 350 are a visible area AA' of the touch panel structure 300. In addition, the touch panel structure 300 further comprises a light shielding layer 360, and the light shielding layer 360 is, for example, a BM layer. The light shielding layer 360 is arranged on the substrate 310 and located at two opposite sides of the visible area AA, namely, on the periphery of the visible area AA', for shielding a circuit connection area in the touch panel structure 300.

Through the foregoing arrangement, reflectivity of the patterned area (namely, an area where the first electrodes of the first conductive layer 320 or the second electrodes of the second conductive layer 340 are arranged) and the non-patterned area (namely, an area where the first electrodes of the first conductive layer 320 or the second electrodes of the second conductive layer 340 are not arranged) in the touch panel (namely, the visible area AA') are similar so human eyes can hardly distinguish the patterned area from the non-patterned area. Therefore, when operating an electronic device with the touch panel structure 300 in the sun, a user does not see diamond-shaped patterns (namely, the shape of the first electrodes of the first conductive layer 320 or the second electrodes of the second conductive layer 340).

In this embodiment, the material of the substrate 310 may be, but is not limited to, glass; the material of the first conductive layer 320 and the second conductive layer 340 may be, but is not limited to, ITO; and the material of the first electrical-insulation layer 330 and the second electrical-insulation layer 350 is a electrical-insulation photoresist material, and the electrical-insulation photoresist material is, for example, acetic esters.

Figure 4:
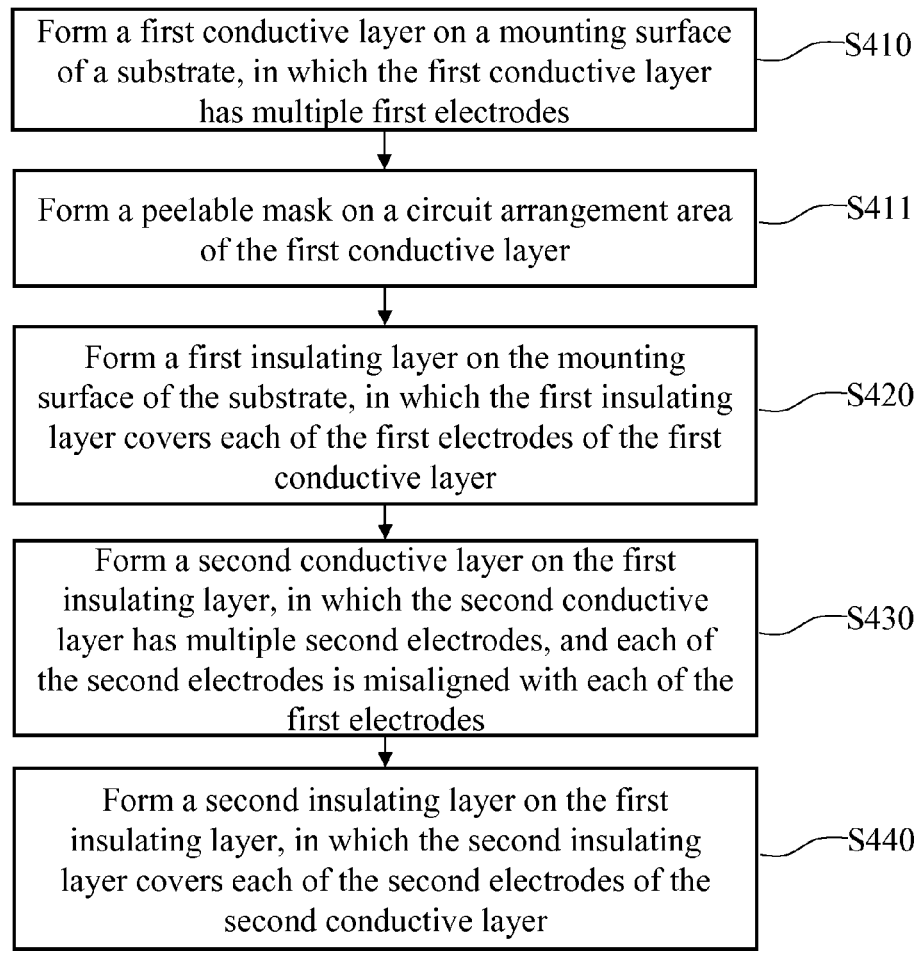
FIG. 4 is a flow chart of a manufacturing method of a touch panel structure according to the disclosure.

According to the description of the embodiment of FIG. 1, a manufacturing method of a touch panel structure may be summarized. Referring to FIG. 4, it is a flow chart of a manufacturing method of a touch panel structure according to an embodiment. In Step S410, a first conductive layer is formed on a mounting surface of a substrate, and the first conductive layer has multiple first electrodes. In Step S420, a first electrical-insulation layer is formed on the mounting surface of the substrate, and the first electrical-insulation layer covers each of the first electrodes of the first conductive layer. In Step S430, a second conductive layer is formed on the first electrical-insulation layer; the second conductive layer has multiple second electrodes, and each of the second electrodes crisscrosses each of the first electrodes. In Step S440, a second electrical-insulation layer is formed on the first electrical-insulation layer, and the second electrical-insulation layer covers each of the second electrodes of the second conductive layer.

In addition, as the first electrical-insulation layer covers the first conductive layer, circuits of the first conductive layer cannot be exposed. In order to avoid such situation, before Step S420 of forming the first electrical-insulation layer, Step S411 is performed, in which a peelable mask is formed on a circuit arrangement area of the first conductive layer. In this way, after the first electrical-insulation layer is formed, a user may remove the peelable mask so the circuits of the first conductive layer are exposed for subsequent connection of the circuits.

In addition, the foregoing manufacturing method further comprises respectively forming a light shielding layer on the substrate and at a side of the first conductive layer and a side of the first electrical-insulation layer opposite to the first conductive layer (for example, two opposite sides of the foregoing visible area AA). The light shielding layer is used to shield a circuit connection area in the touch panel structure.

In this embodiment, the first electrical-insulation layer and the second electrical-insulation layer may be formed by spray coating, and the first conductive layer and the second conductive layer may be formed by screen printing. The material of the substrate may be, but is not limited to, glass. The material of the first conductive layer and the second conductive layer may be, but is not limited to, ITO. The material of the first electrical-insulation layer and the second electrical-insulation layer may be, but is not limited to, an electrical-insulation photoresist material, and the electrical-insulation photoresist material is, for example, acetic esters.

Figure 5:
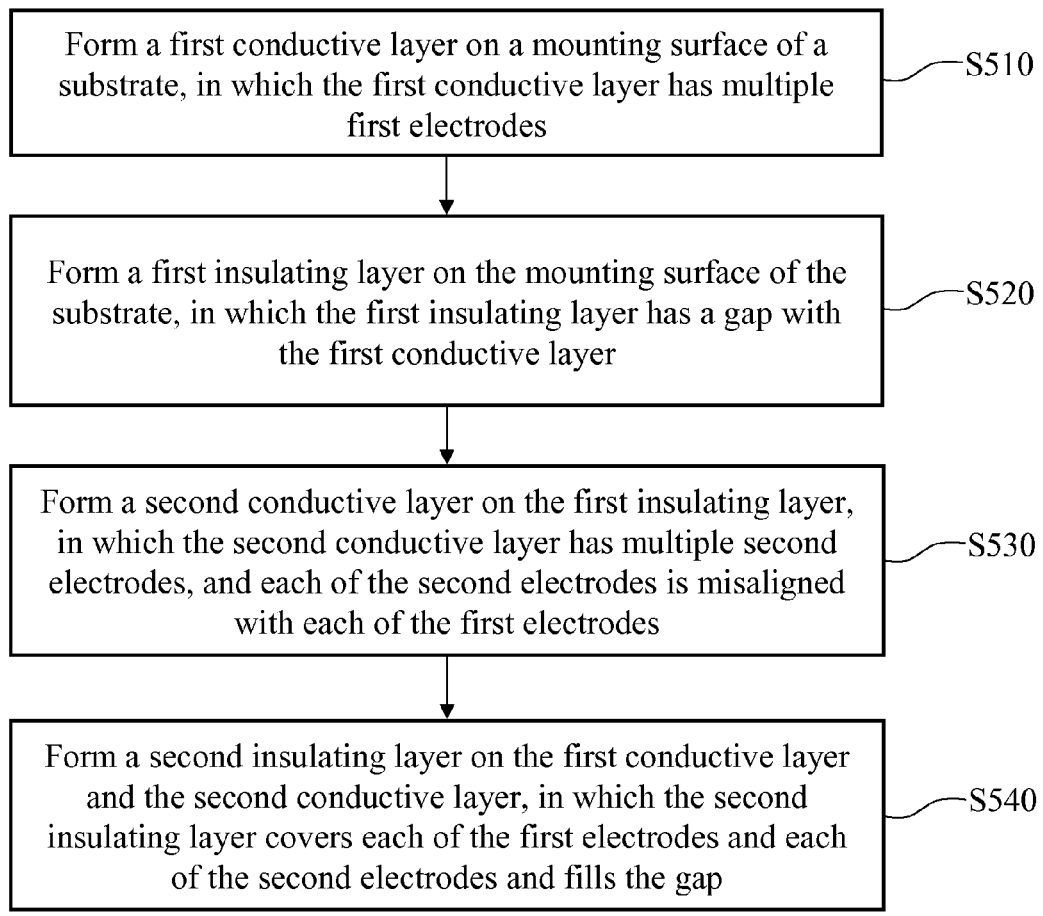
FIG. 5 is a flow chart of a manufacturing method of another touch panel structure according to the disclosure.

According to the embodiment of FIG. 3, a manufacturing method of a touch panel structure may be summarized. Referring to FIG. 5, it is a flow chart of a manufacturing method of another touch panel structure according to an embodiment. In Step S510, a first conductive layer is formed on a mounting surface of a substrate, and the first conductive layer has multiple first electrodes. In Step S520, a first electrical-insulation layer is formed on the mounting surface of the substrate, and a gap is formed between the first electrical-insulation layer and the first conductive layer. In Step S530, a second conductive layer is formed on the first electrical-insulation layer; the second conductive layer has multiple second electrodes, and each of the second electrodes crisscrosses each of the first electrodes. In Step S540, a second electrical-insulation layer is formed on the first conductive layer and the second conductive layer, and the second electrical-insulation layer covers each of the first electrodes and each of the second electrodes and fills the gap.

In addition, the foregoing manufacturing method further comprises respectively forming a light shielding layer on the substrate and at a side of the first conductive layer and a side of the first electrical-insulation layer opposite to the first conductive layer (for example, two sides of the foregoing visible area AA'). The light shielding layer is used to shield a circuit connection area in the touch panel structure.

In this embodiment, the second electrical-insulation layer may be formed by spray coating, and the first conductive layer, the second conductive layer and the first electrical-insulation layer may be formed by screen printing. The first electrical-insulation layer and the second conductive layer have the same pattern, that is, when the first electrical-insulation layer is formed, the pattern of the first conductive layer is not shielded. The material of the substrate may be, but is not limited to, glass. The material of the first conductive layer and the second conductive layer may be, but is not limited to, ITO. The material of the first electrical-insulation layer and the second electrical-insulation layer may be, but is not limited to, an electrical-insulation photoresist material, and the electrical-insulation photoresist material is, for example, acetic esters.

In the touch panel structures and the manufacturing methods thereof provided in the embodiments of the disclosure, the first conductive layer is corresponding to the first electrical-insulation layer, and the second conductive layer is corresponding to the second electrical-insulation layer so the reflectivity of the patterned area (namely, an area where the first electrodes of the first conductive layer or the second electrodes of the second conductive layer are arranged) is similar to that of the non-patterned area (namely, an area where the first electrodes of the first conductive layer or the second electrodes of the second conductive layer are not arranged). Thus, human eyes can hardly distinguish the patterned area and the non-patterned area. In this way, when watching an electronic device with the touch panel structure (for example, in the sun), a user does not see diamond-shaped patterns (namely, the shape assumed by the first electrodes of the first conductive layer or the second electrodes of the second conductive layer).

What is claimed is:

1. A touch panel structure, comprising:
   a substrate, having a mounting surface;
   a first conductive layer, arranged on the mounting surface, the first conductive layer having multiple first electrodes;
   a first electrical-insulation layer, arranged on the mounting surface, a gap formed between the first electrical-insulation layer and the first conductive layer;
   a second conductive layer, arranged on the first electrical-insulation layer, the second conductive layer having multiple second electrodes, and each of the second electrodes crisscrossing each of the first electrodes; and
   a second electrical-insulation layer, arranged on the first conductive layer and the second conductive layer, covering each of the first electrodes and each of the second electrodes, and filling the gap.

2. The touch panel structure according to claim 1, wherein the first electrodes are separated from each other and arranged in a first direction, the second electrodes are separated from each other and arranged in a second direction, and an included angle is formed between the second direction and the first direction.

3. The touch panel structure according to claim 1, wherein the substrate is made of glass.

4. The touch panel structure according to claim 1, wherein the first conductive layer and the second conductive layer are made of indium tin oxide (ITO).

5. The touch panel structure according to claim 1, wherein the first electrical-insulation layer and the second electrical-insulation layer made of an electrical-insulation photoresist material.

* * * * *